United States Patent [19]
Sasano et al.

[11] Patent Number: 5,466,926
[45] Date of Patent: Nov. 14, 1995

[54] COLORED MICROLENS ARRAY AND METHOD OF MANUFACTURING SAME

[75] Inventors: Nobusuke Sasano, Tokyo; Tadashi Enomoto, Kawasaki, both of Japan

[73] Assignee: Kabushiki Kaisha Toshiba, Kawasaki, Japan

[21] Appl. No.: 10,002

[22] Filed: Jan. 27, 1993

[30] Foreign Application Priority Data

Jan. 27, 1992 [JP] Japan ................................ 4-012373

[51] Int. Cl.⁶ .................................................. H01J 3/14
[52] U.S. Cl. ........................................... 250/216; 359/316
[58] Field of Search ................................ 250/216, 226, 250/208.1; 359/316

[56] References Cited

U.S. PATENT DOCUMENTS

| | | | |
|---|---|---|---|
| 4,667,092 | 5/1987 | Ishihara | 250/216 |
| 5,177,637 | 1/1993 | Tsukada | 359/619 |

FOREIGN PATENT DOCUMENTS

| | | |
|---|---|---|
| 59-195861 | 3/1985 | Japan . |
| 3-230101 | 1/1992 | Japan . |

*Primary Examiner*—Stephone B. Allen
*Attorney, Agent, or Firm*—Foley & Lardner

[57] ABSTRACT

A colored microlens array which functions as both a color filter array of different color filter layers and transparent microlenses. The colored microlens array has a transparent basic layer and a plurality of colored microlenses of different colors formed on the transparent basic layer in two dimensional arrangement in accordance with at least one basic color arrangement pattern. The colored microlenses are manufactured by forming semispherical lens forming layer portions on the respective color filter layers of the color filter array and by etching the color filter layers with the formed semispherical lens forming layer portions as a mask, to change in shape the respective color filter layers into the semispherical lenses, respectively. The colored microlenses are applied to solid-state image sensing devices, color liquid crystal display units, etc.

2 Claims, 11 Drawing Sheets

| R G B R G B · · · · · |
|---|
| R G B R G B · · · · · |
| R G B R G B · · · · · |
| · · · · · · · · · · · |
| · · · · · · · · · · · |
| · · · · · · · · · · · |

FIG. 3A

| Ye Cy Ye Cy Ye · · |
|---|
| Mg Gr Mg Gr Mg · · |
| Ye Cy Ye Cy Ye · · |
| Gr Mg Gr Mg Gr · · |
| Ye Cy Ye Cy Ye · · |
| Mg Gr Mg Gr Mg · · |
| · · · · · · · |

COLORED MICROLENS ARRAY AND METHOD OF MANUFACTURING SAME

BACKGROUND OF THE INVENTION

Field of the Invention

The present invention relates to a colored microlens array and a method of manufacturing the same array, and more specifically to a colored microlens array suitable for use as color filters for solid-state image sensing devices, color liquid crystal display units, etc.

Description of the Prior Art

An example of prior art solid-state color image sensing devices will be described hereinbelow with reference to FIG. 1A. In the drawing, the device is composed of a silicon substrate 1, optoelectro transducer regions 2, a light shading film 3, an insulating film 4, a first smoothing layer 5, a first color filter layer 6, a second smoothing (or intermediate) layer 7, a second color filter layer 8, a third smoothing layer 9, a third color filter layer 10, a fourth smoothing layer 11, and a condenser lens layer 12.

In more detail, each optoelectro transducer region 2 is formed by a silicon photodiode, for instance. When light is allowed to be incident upon the optoelectro transducer region 2 through an image forming lens (not shown), the optoelectro transducer region 2 generates an electric charge according to the quantity (luminous power) of the light allowed to be incident thereupon. A great number of optoelectro transducer regions 2 are arranged in matrix fashion on the surface of the silicon substrate 1 as picture elements (i.e. pixels). Therefore, the optoelectro transducer regions 2 generate electric charges according to the brightness of an image projected upon the image sensing device. In the vicinity of the respective optoelectro transducer regions 2, charge transfer regions (not shown) are formed to transfer the generated charges to a preamplifier (not shown) so that the transferred charges are transformed into electric signals.

On the optoelectro transducer regions 2 and the charge transfer regions, the insulating film 3 formed of aluminum, for instance is laminated via the light shading film 4 in order to prevent light from being allowed to be incident upon the areas other than the optoelectro transducer regions 2. The uneven surface caused by forming aperture portions of the light shading film 3 is buried even by additionally forming the first smoothing layer 5.

On this first smoothing layer 5, the first color (e.g. red) filter layer 6 is formed so as to cover the optoelectro transducer regions 2 for transducing only the red components of light into electricity. This color filter layer 6 is formed by dyeing gelatin red, for instance. On the first color filter layer 6, the second smoothing (intermediate) layer 7 is formed to prevent color mixture between the two adjacent color filter layers 6 and 8 and to smooth the surface thereof.

Further, on the second smoothing layer 7, the second color (e.g. green) filter layer 8 is formed so as to cover the optoelectro transducer regions 2 for transducing only the green components of light into electricity. This color filter layer 8 is formed by dyeing gelatin green, for instance. Similarly, on the second color filter layer 8, the third smoothing (intermediate) layer 9 is formed to prevent color mixture between the two adjacent layers 8 and 10 and to smooth the surface thereof.

Further, on the third smoothing layer 9, the third color (e.g. blue) filter layer 10 is formed so as to cover the optoelectro transducer regions 2 for transducing only the blue components of light into electricity.

This color filer layer 10 is formed by dyeing gelatin blue, for instance. On the third color filter layer 10, the fourth smoothing (intermediate) layer 11 is formed to smooth the surface thereof.

Furthermore, on the fourth smoothing layer 11, the condenser lens layer 12 is formed. The condenser lens layer 12 is a group of microlenses for condensing light projected upon the surface of the solid-state color image sensing device through the image forming lens, onto the respective optoelectro transducer regions (pixels) 2.

In the prior art color image sensing device as describe above, a plurality of the smoothing (intermediate) layers and a plurality of the color filter layers are laminated one upon another so as to form a color filter array, and the microlens layer is formed on the outermost portion thereof. Therefore, the respective color components of light can be condensed upon the respective optoelectro transducer regions, as depicted by the solid lines in FIG. 1B (in which the same reference numerals are retained). Accordingly, it is possible to improve the apparent aperture ratio and thereby increase the light receiving sensitivity.

Figure 1A:
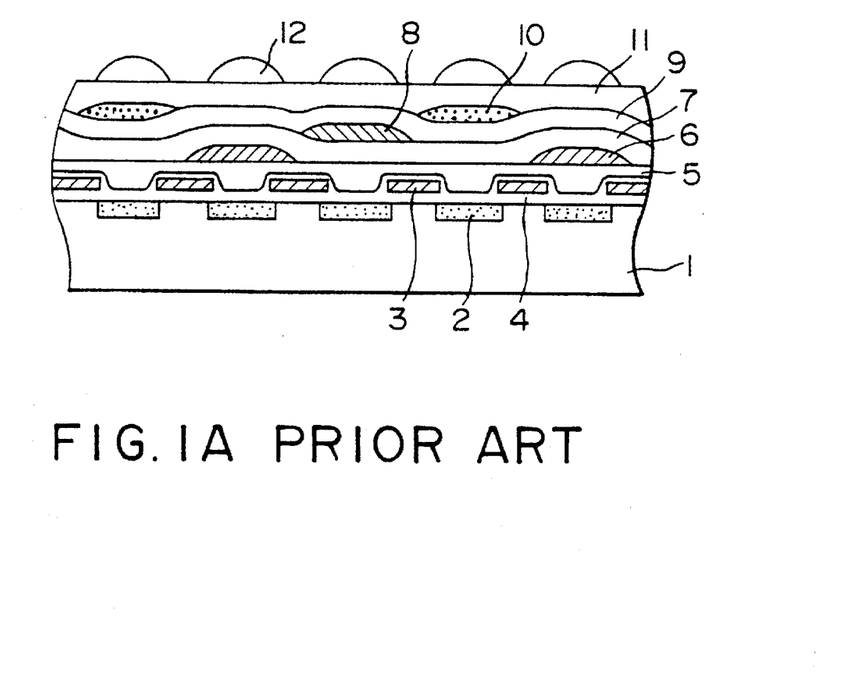
FIG. 1A is a cross-section view showing an example of prior art solid-state color-image sensing device.
Figure 1B:
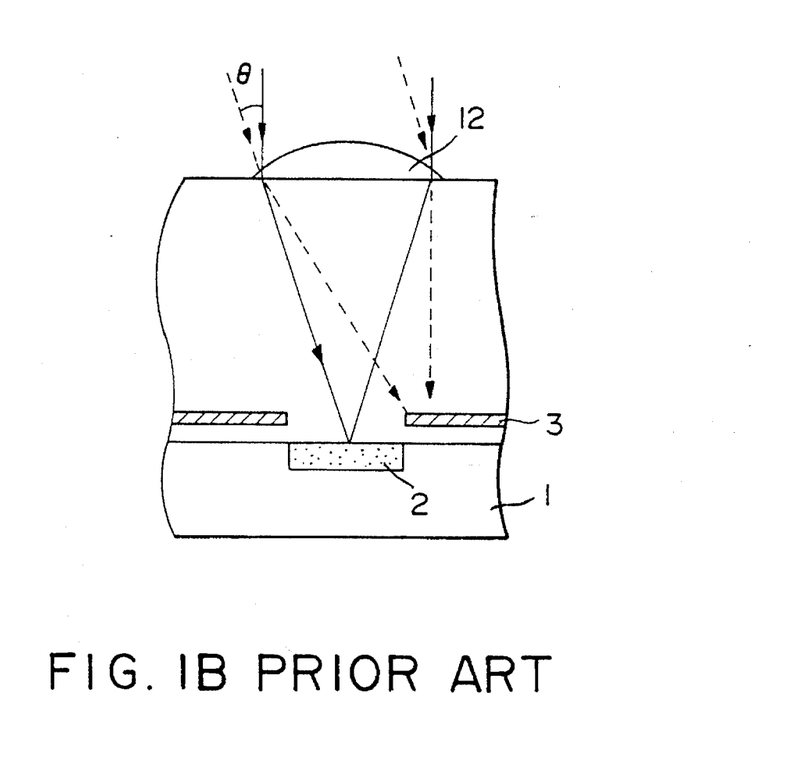
FIG. 1B is an enlarged cross-sectional view showing the prior art solid-state image sensing device, for assistance in explaining a drawback involved therein.

In the prior art color image sensing device, however, since the color filter array is formed by laminating three sorts of color filter layers, the distance between the microlens layer 12 and the aperture portions of the light shading film 3 is as long as 10, also as shown in FIG. 1B. Consequently, when light allowed to be incident upon the microlens obliquely increases as when a diaphragm (an iris) of a camera is relatively opened, the light converged through the microlens is misaligned from the center of the aperture of the light shading film 3 or further offset from the aperture thereof, as depicted by dashed lines in FIG. 1B, thus reducing the light converging rate upon the optoelectro transducer region 2. In addition, when the condensed light reaches the aperture end of the light shading film 3, the signal charge is mixed with the signal charge of the adjacent optoelectro transducer regions (pixels) and the charge transfer regions, with the result that there exists a problem in that smear is produced.

SUMMARY OF THE INVENTION

With these problems in mind, therefore, it is the primary object of the present invention to provide a colored microlens array, which can realize both the functions of the colored filter array of a plurality of different color filter layers and the transparent microlens layer by use of only a colored microlens array.

Further, a second object of the present invention is to provide a method of manufacturing the colored microlenses.

Further, a third object of the present invention is to provide a solid-state color image sensing device provided with the colored microlenses, by which the light converging rate or the light sensitivity of the image sensing device will not be reduced even when light is allowed to be incident thereupon obliquely, while preventing smear caused in the image sensing device.

Further, a fourth object of the present invention is to provide a color liquid crystal display unit provided with the colored microlenses, by which a wide angle of visual field can be obtained.

To achieve the above-mentioned first object, the colored microlens array of the present invention comprises: a transparent basic layer; and a plurality of colored microlenses of different colors formed on said transparent basic layer in two dimensional arrangement in accordance with at least one basic color arrangement pattern.

The thickness of said transparent basic layer differs according to color of said colored microlens formed thereon in such a way that foci of said plural colored microlenses are located substantially on the same plane. Alternatively, a radius of curvature of each of said plural colored microlenses differs according to color of said colored microlens in such a way that foci of said plural colored microlenses are located substantially on the same plane.

To achieve the above-mentioned second object, the method of manufacturing colored microlenses according to the present invention comprises the steps of: forming a transparent basic layer; forming a color filter array composed of a plurality of color filter layers on the transparent basic layer; forming a lens forming layer on the color filter array; patterning the lens forming layer with a microlens array pattern, to leave lens forming layer portions only at positions where the colored microlenses are to be formed; forming the remaining lens forming layer portions into semispherical shape and etching the semispherical lens forming layer portions and the color filter layers simultaneously by use of the formed semispherical lens forming portions as a mask, to deform the color filter layers into semispherical microlenses, respectively.

The above-mentioned step of forming the color filter array comprises the following steps of: forming a first color filter layer on the transparent basic layer; patterning the first color filter layer with a first color arrangement pattern, to leave first color filter layer portions in two dimensional arrangement only at positions where first colored microlenses are to be formed; and repeating the first color filter layer forming and patterning steps to form other color layers of different colors, for formation of the multicolor filter array. Alternatively, the above-mentioned step of forming the color filter array comprises the following steps of: forming a first transparent electrode layer on the transparent basic layer; patterning the first transparent electrode layer with a first color arrangement pattern, to leave a first transparent electrode layer in stripe shape only at positions where first colored microlenses are to be formed; applying a voltage to the first transparent electrode layer within a first color dye solvent to deposit a first color dye on the first transparent electrode layer; and repeating the first color filter layer forming, patterning and voltage applying steps to form other color layers of different colors, for formation of the multicolor filter array.

The above-mentioned step of forming the remaining lens forming layer portions into semispherical shape comprises the following steps of: melting the lens forming layer portions at a temperature lower than a melting point of the color filter array, to deform the melted lens forming layer portions into semispherical shape on the basis of surface tension thereof; and cooling the deformed lens forming layer portions. Alternatively, the above-mentioned step of forming the remaining lens forming layer portions into semispherical shape comprises the following steps of: preparing a solvent; and reacting the remaining lens forming layer portions on the prepared solvent to dissolve partially the lens forming portions into semispherical shape on the basis of chemical treatment.

The transparent basic layer is an undulate transparent basic layer with thickness different according to color of the colored microlenses formed thereon, to allow foci of the plural colored microlenses to be located substantially on the same plane by modifying distances between the focal plane and the colored microlenses. Alternatively, the lens forming layer is composed of plural lens forming layers each having a thickness different according to color of the colored microlenses, to allow foci of the plural colored microlenses to be located substantially on the same plane by modifying radii of curvature of the colored microlenses.

To achieve the above-mentioned third object, the solid-state color image sensing device for transducing an optical image into image signals representative of color components according to the present invention comprises: a plurality of optoelectro transducer regions arranged on a silicon substrate in two dimensional way for generating electric charges according to luminous energy of light allowed to be incident thereupon; a light shading film formed on the silicon substrate for shading the silicon substrate other than aperture portions of said optoelectro transducer regions; a smoothing layer for burying the aperture portions of said light shading film; and a colored microlens array composed of microlenses of different colors arranged in accordance with a predetermined two dimensional regular color arrangement pattern, the colored microlenses being formed on said smoothing layer and over said optoelectro transducer regions for allowing the optical image to be incident upon said optoelectro transducer regions, respectively.

Further, to achieve the above-mentioned fourth object, the liquid crystal display unit according to the present invention comprises: a liquid crystal microshutter layer formed in a liquid crystal panel, for forming an image on the basis of light transmitted therethrough; and a colored microlens array composed of microlenses of different colors arranged in accordance with a predetermined two dimensional regular color arrangement pattern, the colored microlenses being formed on said liquid crystal display panel and over the microshutters for providing a wide angle of visual field.

In the colored microlens array according to the present invention, the microlenses themselves function as the color filters additionally.

To manufacture the colored microlenses, the lens forming layer is first formed on the color filter array of different color filter layers; the lens forming layer is patterned so as to be left only at positions where the colored microlenses are to be formed; the patterned lens forming layer portions are formed into semispherical shape by heat treatment for instance, respectively; and the color filter layers are etched with the semispherical lens forming layer portions as a mask, to transfer the semispherical shape to the color filter layers, respectively. In other words, the color filter layers of the color filter array are changed into the colored microlenses in shape.

As a result, it is possible to realize a colored microlens array which can function both the prior art color filter layers stacked one upon another and the transparent microlenses formed on the color filter layers. Since the colored microlens array can function also as the prior art color filter array, when applied to the solid-state color image sensing device, the microlens layer can be formed in the close vicinity of the optoelectro transducer regions, so that it is possible to increase the light sensitivity while preventing smear. Further, when applied to the liquid crystal display unit as the color filter array, it is possible to increase the angle of visual field on the display panel thereof.

DETAILED DESCRIPTION OF THE PREFERRED EMBODIMENTS

Embodiments of the present invention will be described hereinbelow with reference to the attached drawings.

Figure 2A:
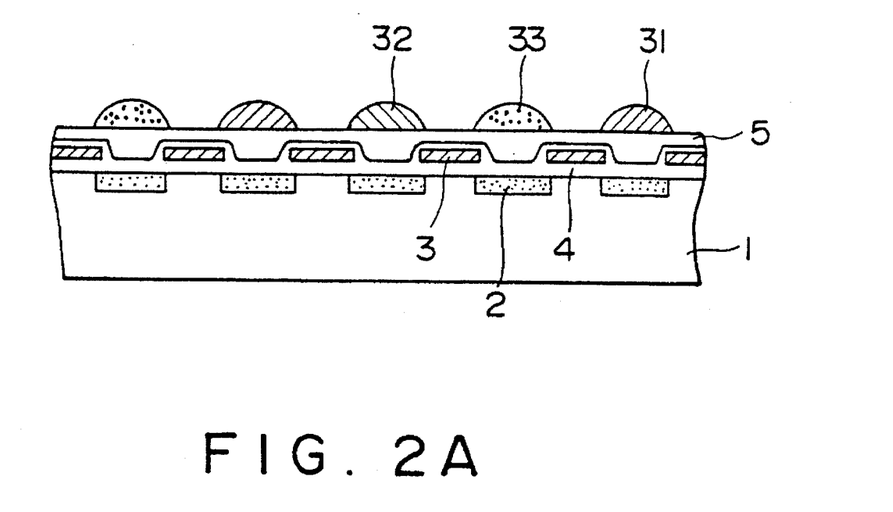
FIG. 2A is a cross-sectional view showing an image sensing device formed with colored microlenses according to the present invention.

FIG. 2A shows a solid-state color image sensing device to which the colored microlens according to the present invention is applied, in which the same reference numerals as in FIG. 1A are retained. In FIG. 2A, the image sensing device is composed of a silicon substrate 1, optoelectro transducer regions 2, a light shading film 3, an insulating film 4, and a smoothing layer 5, and colored microlenses of different colors 31, 32 and 33.

In comparison with the prior art image sensing device shown in FIG. 1A, it should be noted that only colored microlenses 31, 32 and 33 are formed, instead of the plural color filter layers 6, 8 and 10 and the plural smoothing (intermediate) layers 7, 9 and 11 and additionally the transparent microlenses 12.

In more detail, each optoelectro transducer region 2 is formed by a silicon photodiode, for instance. When light is allowed to be incident upon the optoelectro transducer region 2 through an image forming lens (not shown), the optoelectro transducer region 2 generates an electric charge according to the quantity (luminous power) of the light allowed to be incident thereupon. A great number of optoelectro transducer regions 2 are arranged in matrix fashion on the surface of the silicon substrate 1 as picture elements (i.e. pixels). Therefore, the optoelectro transducer regions 2 generate electric charges according to the brightness of an image projected upon the image sensing device. In the vicinity of the respective optoelectro transducer regions 2, charge transfer regions (not shown) are formed to transfer the generated charges to a preamplifier (not shown) by which the transferred charges are transformed into electric image signals. As the charge transfer regions, various devices such as CCD (charge coupled device), BBD (bucket brigade device), etc. can be used.

On the optoelectro transducer regions 2 and the charge transfer regions, the light shading film 3 formed of aluminum, for instance is laminated via the insulating film 4 in order to prevent light from being allowed to be incident upon the areas other than the optoelectro transducer regions 2. The insulating film 4 is formed of silicon-oxide film for instance. The uneven surface (caused when the aperture portions of the light shading film 3 are formed) is made even by additionally forming the smoothing (transparent basic) layer 5. The smoothing layer 5 is formed of a material of acryl or polystyrene, for instance.

Figure 3A:
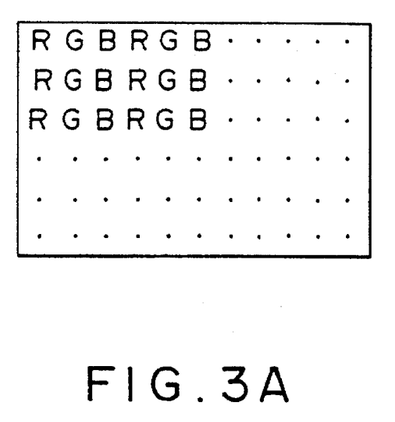
FIGS. 3A and 3B are views showing examples of basic color arrangement patterns of different colored microlenses.
Figure 3B:
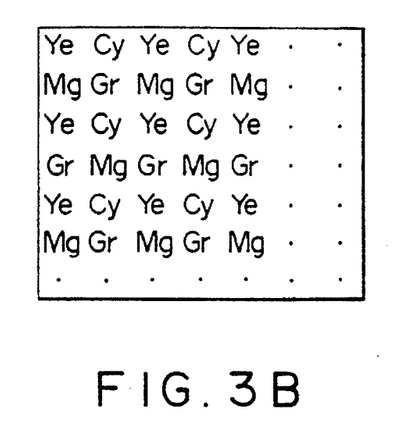

Being different from the prior art device, a plurality of colored microlenses 31, 32 and 33 are arranged directly on the smoothing layer 5 in matrix fashion so as to be located over the optoelectro transducer regions 2. The centers of the microlenses are respectively aligned with the centers of the aperture portions of the light shading film 3. The optoelectro transducer regions 2 transduce the color components of light introduced through the colored microlenses into the corresponding electric signals, respectively. The colored microlens 31 is red; the colored microlens 32 is green; and the colored microlens is blue, for instance. The sorts of colored microlenses are appropriately combined by selecting two or three colors from the three primary colors (red, green and blue) and further from the three complementary colors (cyan, magenta and yellow) according to the image forming methods of the CCD camera. Further, the shape of the colored microlens is appropriately determined according to the color, material and refractive index of the colored microlens, so that an appropriate light convergence can be attained. However, the shape is semispherical, preferably. The color of the microlens is determined by the lens material itself or by dyeing the lens material with a dye. Further, various arrangement pattern can be applied to the arrangement of the colored microlenses and the optoelectro transducer regions according to the color image forming methods. The color arrangement pattern can be usually determined by combining one or two or more basic color arrangement patterns obtained by arranging different colored microlenses in two dimensional way. FIGS. 3A and 3B show examples of the basic color arrangement patterns. In the figures, R, G, B, Cy, Mg and Ye represent red, green, blue, cyan, magenta and yellow, respectively. Here, since the structures of the optoelectro transducer regions, the charge transfer regions, and the charge reading regions of the solid-state color image sensing device are all well known, any detailed description thereof are omitted herein.

Figure 2B:
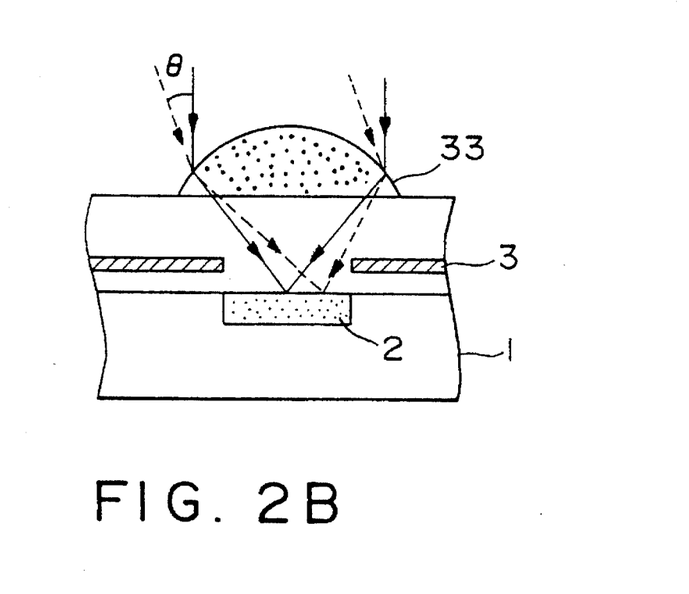
FIG. 2B is an enlarged cross-sectional view showing the image sensing device according to the present invention, for assistance in explaining an advantage thereof.

In the color image sensing device according to the present invention as described above, it is possible to replace the prior art color filter array composed of color filter layers 6, 8 and 10 and the smoothing (intermediate) layers 7, 9 and 11 (all shown in FIG. 1A) and the transparent microlens 12 with a single microlens layer. In other words, in the present invention, the colored microlenses 31, 32 and 33 constitute a single-layer color filter array. When the colored microlenses according to the present invention are formed in the image sensing device, it is possible to form the microlenses in the close vicinity of the optoelectro transducer regions 2 of the solid-state color image sensing device. That is, since the colored microlenses 33 are located in the close vicinity of the optoelectro transducer regions 2 and further just over the aperture portions of the light shading film 3, the light allowed to be incident upon the microlens 33 is introduced onto the optoelectro transducer region 2, as depicted by solid and dashed lined in FIG. 2B, thus it being possible to improve the sensitivity of the image sensing device. In addition, light is prevented from being allowed to be incident upon the charge transfer region formed near the optoelectro transducer region 2, thus it being possible to suppress the occurrence of smear on an image.

The method of manufacturing the colored microlens array composed of a great number of microlenses of different colors on the smoothing layer of the solid-state color image sending device according to the present invention will be described hereinbelow. In the method of the present invention, it should be noted that the color filter arrays are changed into the colored microlenses in shape, respectively.

First, the steps of forming the color filter array composed of color filter layers will be explained with reference to FIGS. 4(a) to (d). In accordance with the well-known technique, the optoelectro transducer regions 2, the insulating film 4, the light shading film 3, the smoothing layer 5 are formed on the silicon substrate 1 to form a CCD image forming sections.

Figure 4A:
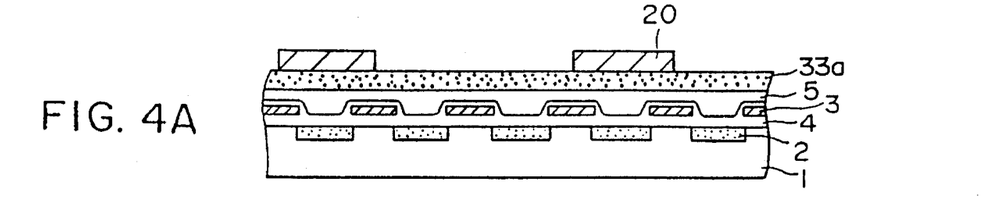
FIGS. 4(a) to (d) are cross-sectional views for assistance in explaining the steps of forming a color filter array composed of plural color filter layers.

With the smoothing layer 5 of the CCD image forming sections as its basic layer, a third-color (e.g. blue) layer 33a of the three primary colors is formed on the smoothing layer 5. The color layer 33a is patterned by use of an arrangement pattern for the optoelectro transducer regions of blue component (not shown), to form a blue filter layer 33b into a mosaic shape on the smoothing layer 5. In more detail, after the third-color layer 33a has been laminated on the smoothing layer 5, a photoresist 20 is applied all over the surface of the color layer 33a. The photoresist 20 is exposed through the pattern corresponding to the third-color optoelectro transducer regions and further developed, so that the remaining photoresist 20 covers the third-color optoelectro transducer regions as shown in FIG. 4(a). By using the remaining photoresist 20 as a mask, the color layer 33a is etched to leave only the color layer 33a as the blue filter layer 33b for covering the third-color optoelectro transducer regions. Thereafter, the remaining photoresist 20 is removed by use of a solvent.

Figure 4B:
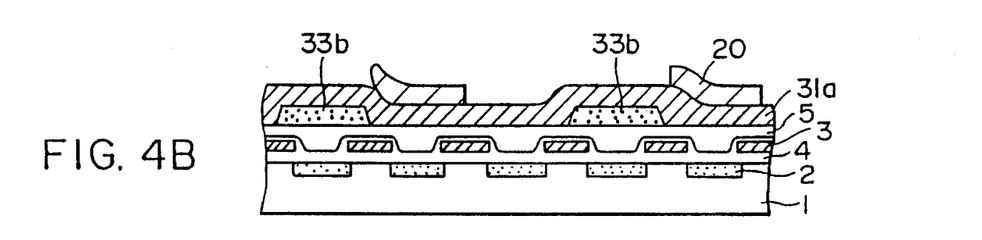

Successively, a first-color (e.g. red) layer 31a is formed on the smoothing layer 5 and the blue filter layer 33b. The formed color layer 31a is patterned by use of an arrangement pattern for the optoelectro transducer regions of red component (not shown) to form a red filter layer 31a into a mosaic shape on the smoothing layer 5. In more detail, after the color layer 31a has been laminated on the smoothing layer 5 and the blue filter layer 33b, a photoresist 20 is applied all over the surface of the color layer 31a. The photoresist 20 is exposed through the pattern corresponding to the first-color optoelectro transducer regions and further developed, so that the remaining photoresist 20 covers the first-color optoelectro transducer regions as shown in FIG. 4(b). By using the remaining photoresist 20 as a mask, the color layer 31a is etched to leave only the color layer 31a as the red filter layer 31b for covering the first-color optoelectro transducer regions. Thereafter, the remaining photoresist 20 is removed by use of a solvent.

Figure 4C:
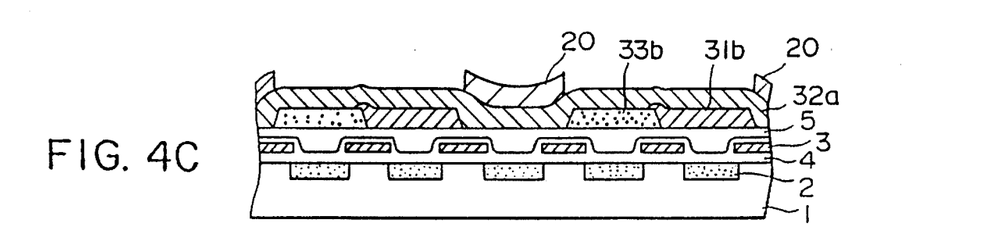

Similarly, a second-color (e.g. green) layer 32a is formed on the smoothing layer 5 and the red filter layer 31b the blue filter layer 33b. The formed color layer 32a is patterned by use of an arrangement pattern for the optoelectro transducer regions of green component (not shown) to form a green filter layer 32b into a mosaic shape on the smoothing layer 5. In more detail, after the color layer 32a has been laminated on the smoothing layer 5, the red filter layer 31b and the blue filter layer 33b, a photoresist 20 is applied all over the surface of the green layer 32a. The photoresist 20 is exposed through the pattern corresponding to the second-color optoelectro transducer regions and further developed, so that the remaining photoresist 20 covers the second-color optoelectro transducer regions as shown in FIG. 4(c). By using the remaining photoresist 20 as a mask, the green layer 32a is etched to leave only the green layer 32a as the green filter layer 32b for covering the second-color optoelectro transducer regions. Thereafter, the remaining photoresist 20 is removed by use of a solvent.

As the film material for the color filter layers 31b, 32b and 33b, PVA (polyvinyl alcohol), synthetic coloring material, pigment dispersing type film (e.g. acrylic base film), etc. can be used.

Figure 4D:
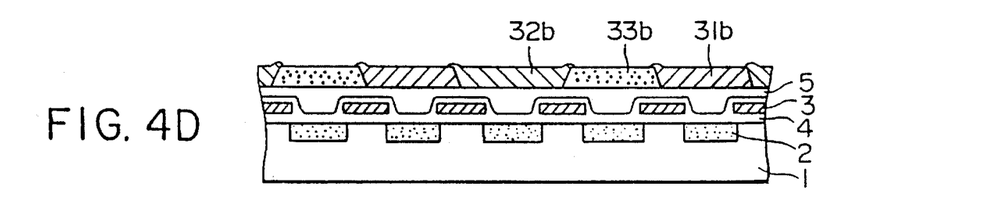

As described above, it is possible to form a color filer array composed of a-plurality of color filter layers 31b, 32b and 33b, as shown in FIG. 4(d). Various patterns such as mosaic, stripe, etc. can be formed as the arrangement patterns of the color filter array according to the image forming methods.

The steps of forming the colored microlenses will be described hereinbelow with reference to FIGS. 5(a) to (d), in which the same reference numerals have been retained for similar regions or elements which have the same functions in FIGS. 4(a) to (d) without repeating any detailed description thereof.

The feature of the method of forming the colored microlenses according to the present invention is to form semispherical lens forming layer portions on the respective color filter layers and further to etching the formed semispherical lens forming layer portions so as to transfer the semispherical shape to the color filter layers, respectively. That is, the color filter layers themselves are changed in shape into semispherical colored microlenses.

Figure 5A:
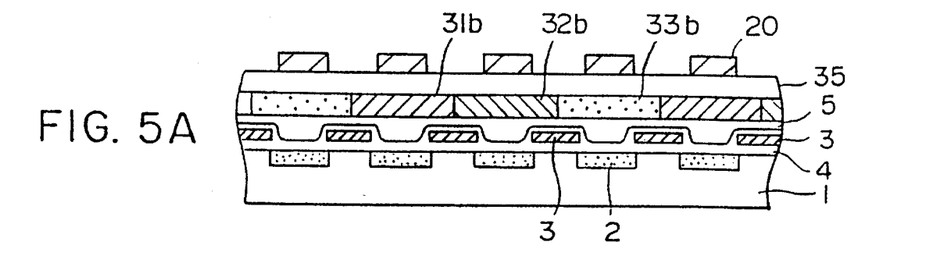
FIGS. 5(a) to (d) are cross-sectional views for assistance in explaining the steps of forming a colored microlens array according to the present invention on the solid-state image sensing device.
Figure 5B:
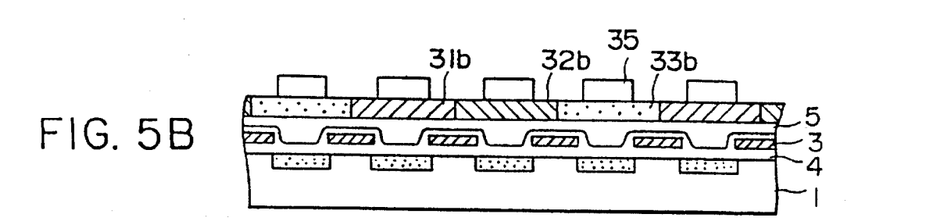

In accordance with the procedure as already described with reference to FIGS. 4(a) to (d), the color filter array composed of the three color filter layers 31b, 32b and 33b is formed on the solid-state color image sensing device. A lens forming layer 35 is formed on the color filter array to form the microlenses. The lens forming layer 35 is patterned by use of a microlens arrangement pattern. In more detail, a photoresist 20 is applied all over the surface of the lens forming layer 35. The photoresist 20 is exposed through an etching pattern (not shown) corresponding to the microlens array pattern and further developed, so that the remaining photoresist 20 covers the aperture portions of the light shading film 3, as shown in FIG. 5(a). By using the remaining photoresist 20 as a mask, the lens forming layer 35 is etched to leave only the lens forming layer 35 over the aperture portions of the light shading film 3, as shown in FIG. 5(b). The remaining lens forming layer 35 is further formed into a lens shape, preferably into a semispherical shape by heat treatment or chemical treatment.

Figure 5C:
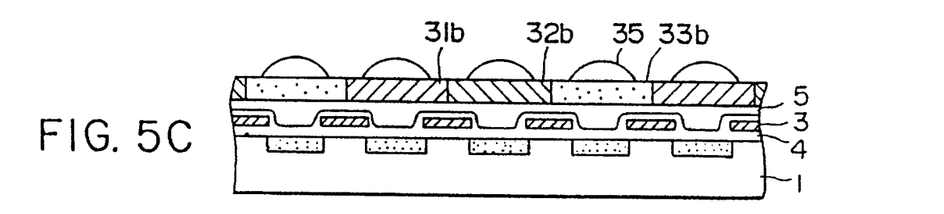

In the case of the heat treatment, a material, such as a photoresist, having a melting point lower than that of the color filter layers is previously selected for the material of the lens forming layer 35. This is because it is possible to heat and further melt the lens forming layer 35 at a temperature lower than the melting point of the color filter layers. The melted lens forming layer 35 is changed into a semispherical shape due to the surface tension, as shown in FIG. 5(c). The heated lens forming layer 35 is cooled to fix the microlenses in the semispherical shape. In the case of the chemical treatment; on the other hand, the lens forming layer 35 is dissolved by a solvent into a curved shape by appropriately selecting the combination of the material of the lens forming layer 35 and the solvent.

Figure 5D:
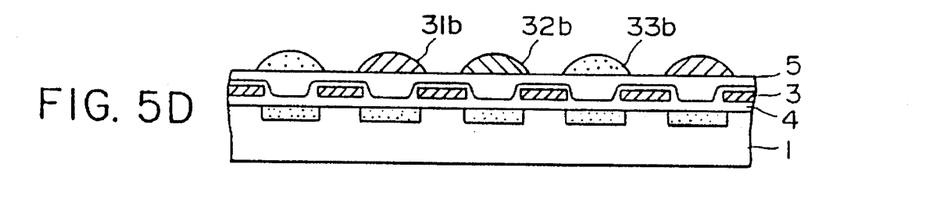

As described above, it is possible to form the lens-shaped lens forming layer 35 on the respective color filter layers. By using the lens-shaped lens forming layer 35 as a mask, the lens forming layer 35 and the color filter layers 31b, 32b and 33b are all etched from the side of the lens forming layer 35 in accordance with RIE (reactive ion etching) technique, for instance in order to form the respective color filter layers into convex lens shape as shown in FIG. 5(d).

As a result, it is possible to form color microlenses in close vicinity of the optoelectro transducer regions 2 and over the aperture portions of the light shading film 3. The colored microlens is formed for each optoelectro transducer region (pixel) being classified according to the color. In the embodiment described above, the three primary color filter layers are formed. Without being limited thereto, any given color filter layers can be formed as occasion demands.

Figure 6:
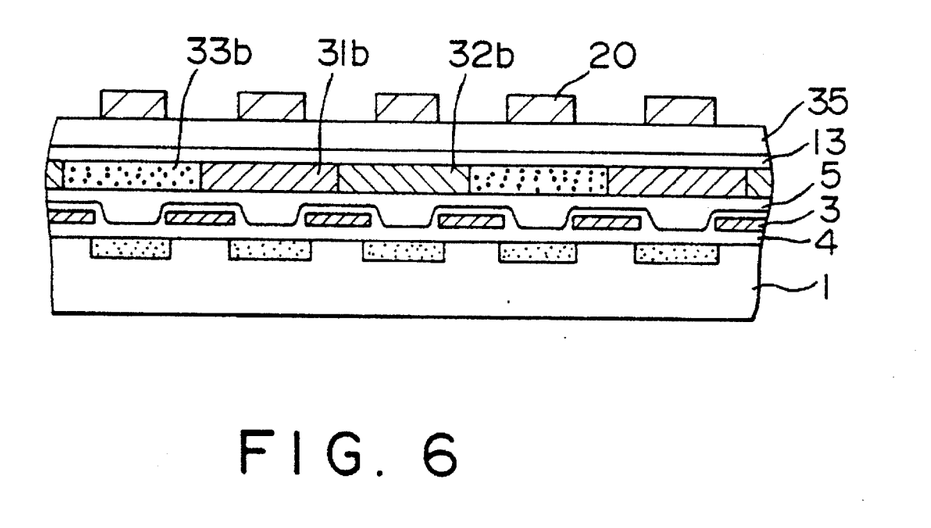
FIG. 6 is a cross-sectional view showing a modification of the image sensing device according to the present invention, in which an intermediate layer 13 is additionally formed.

FIG. 6 shows a modification of the steps of forming the colored microlenses on the color filter layers, in which an additional intermediate layer 13 of a material of acryl or polystyrene, for instance, is formed between the color filter array composed of the three color filter layers 31b, 32b and 33b and the lens forming layer 35. The formed intermediate layer 13 is effective to prevent the lens forming layer 35 from being mixed with the color filter layers (i.e. mix layer).

Another method of forming the color filter layers will be described hereinbelow with reference to FIGS. 7A to 7D. In this method, the color filter layers are formed on the CCD image forming sections in accordance with electric plating method. In FIGS. 7A to 7D, the same reference numerals have been retained for similar regions or elements which have the same functions in FIGS. 2A, without repeating any detailed description thereof.

Figure 7A:
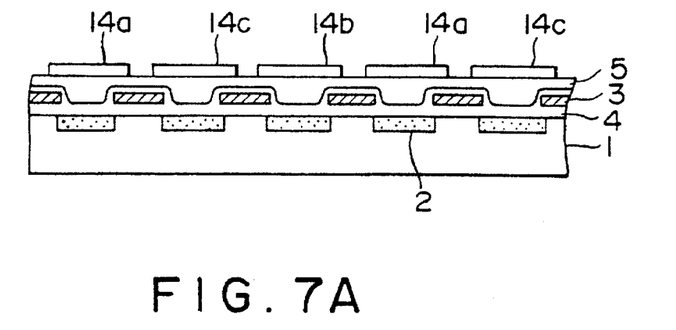
FIG. 7A is a cross-sectional view for assistance in explaining the other method of forming the color filter array composed of plural color filter layers.
Figure 7B:
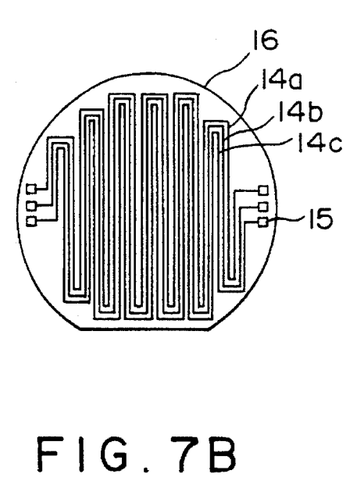
FIG. 7B is a plane view showing a wafer on which transparent electrodes are formed.
Figure 7C:
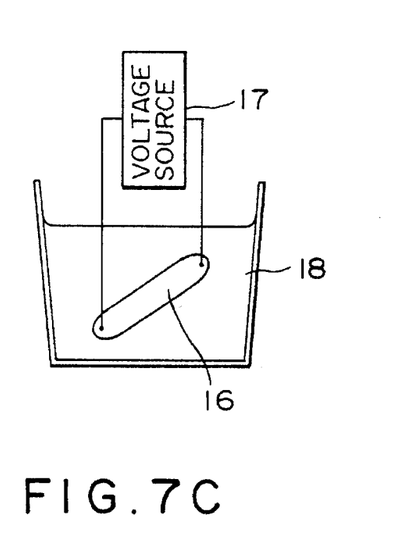
FIG. 7C is an illustration for assistance in explaining a method of electric plating.
Figure 7D:
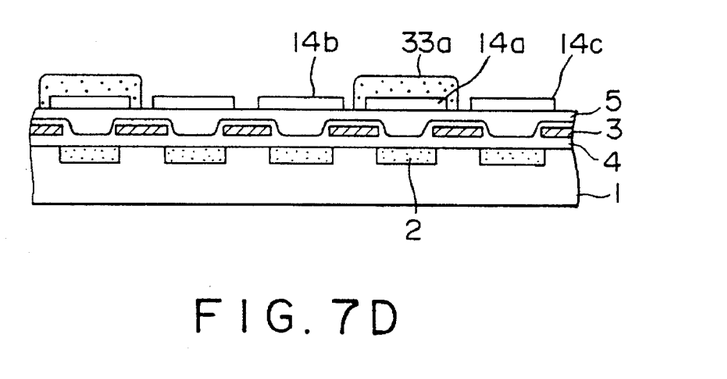
FIG. 7D is a cross-section view for assistance in explaining the color filter layer deposited by electric plating.

First, a transparent electrode film is formed on the smoothing layer 5 on the CCD image forming sections as shown in FIG. 7A. The formed smoothing film 5 is patterned to form transparent electrodes 14a to 14c into a strip shape so as to cover the aperture portions of the light shading film 3. The ends of the respective transparent electrodes are connected to terminals 15 formed on a wafer 16 on which a great number of CCD image forming sections are formed, as shown in FIG. 7B. By use of these electrode terminals formed on the wafer, a dc voltage source 17 is connected across the transparent electrode to apply an appropriately selected dc voltage under the condition that the wafer 16 is immersed into a color solvent 18, as shown in FIG. 7C. Therefore, die agent (e.g. blue) within the color solvent 18 is deposited onto the transparent electrode (e.g. 14a) to form the blue filter layer 33a, for instance as shown in FIG. 7D. The other red and green filter layers 31a and 32a can be formed in the same way.

In general, the refractive index of a lens is different according to the wavelengths of light passed through the lens. Accordingly, it is preferable to form the respective colored microlenses so as to have different focal distances or the different radii of curvature according to the wavelengths of the extracted light components or the material of the colored microlenses, in order to allow the color components extracted through the respective colored microlenses to be incident accurately upon the optoelectro transducer regions, respectively.

The method of adjusting the focal distance of the respective colored microlenses according to the color of the colored microlenses will be described hereinbelow with reference to FIGS. 8(a) to (d). In FIGS. 8(a) to (d), the same reference numerals have been retained for similar regions or elements which have the same functions in FIGS. 5(a) to (d), without repeating any detailed description thereof.

Figure 8A:
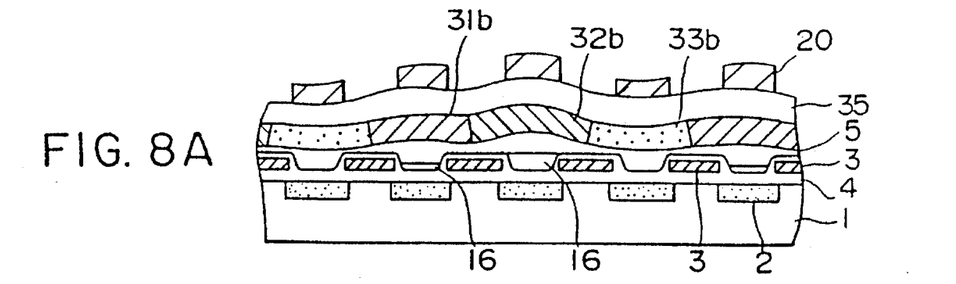
FIGS. 8(a) to (d) are cross-sectional views for assistance in explaining the steps of forming the colored microlenses of different heights from the optoelectro transducer regions on the solid-state image sensing device.

In this embodiment, before the smoothing layer 5 is formed, the grooves corresponding to the aperture portions of the light shading film 3 are buried by a burying material 16 of a material of acryl or polystyrene, for instance, in such a way that the depths of the grooves change according to the focal distances of the colored microlenses formed thereover, respectively. In more detail, the burying material 16 is deposited within the groove by a first thickness corresponding to the focal distance of the first colored lens. Thereafter, the burying material 16 is removed by use of a mask for covering only the aperture portions of the optoelectro transducer regions for transducing only the first color component into electric signal, thus the burying material 16 remains only in the aperture portions.

Further, the burying material 16 is deposited within the groove by a second thickness corresponding to the focal distance of the second colored lens. Thereafter, the burying material 16 is removed by use of a mask for covering only the aperture portions of the optoelectro transducer regions for transducing only the second color into electric signal, thus the burying material 16 remains only in the aperture portions.

As described above, it is possible to deposit the burying material 16 by different thicknesses within the respective aperture portions of the respective optoelectro transducer regions for the first and second colors. As the burying material 16, a transparent material the same as that of the smoothing layer 5 can be preferably used.

After the above-mentioned procedure, the smoothing layer 5 is formed thereon. The upper surface of the formed smoothing layer 5 is undulated according to the thickness of the burying material 16, so that it is possible to determine the thickness of the basic film composed of the smoothing layer 5 and the burying material 16 according to the focal distance of the colored microlens formed on the surface thereof.

Figure 8B:
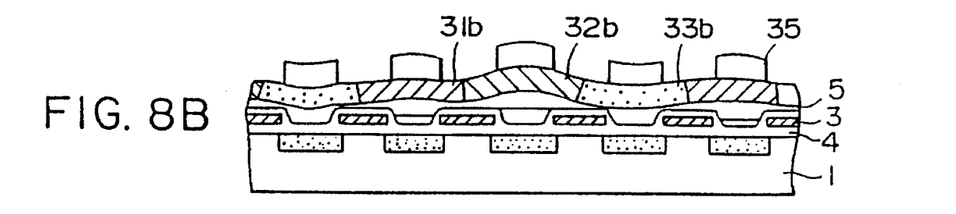
Figure 8C:
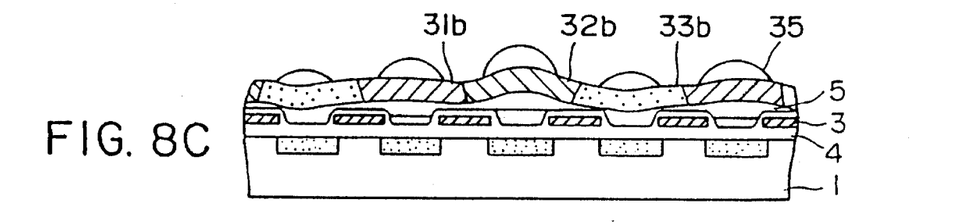

On the CCD image forming section constructed as described above, the three color filter array is formed in accordance with the process already described with reference to FIGS. 4(a) to (d). Further, the lens forming layer 35 is formed on the color filter array to form the microlenses. The formed lens forming layer 35 is patterned by use of a microlens arrangement pattern. In more detail, a photoresist 20 is applied all over the surface of the lens forming layer 35. The photoresist 20 is exposed through an etching pattern (not shown) corresponding to the microlens array pattern and further developed, so that the remaining photoresist 20 covers the aperture portions of the light shading film 3, as shown in FIG. 8(a). By using the remaining photoresist 20 as a mask, the lens forming layer 35 is etched to leave only the lens forming layer 35 over the aperture portions of the light shading film 3, as shown in FIG. 8(b). The remaining lens forming layer 35 is further formed into a lens shape, preferably into a semispherical shape by heat treatment, for instance. The melted lens forming layer 35 is changed into a semispherical shape due to the surface tension, as shown in FIG. 8(c). The heat treatment temperature is higher than the melting point of the lens forming layer 35 but lower than that of the color filter layers.

Figure 8D:
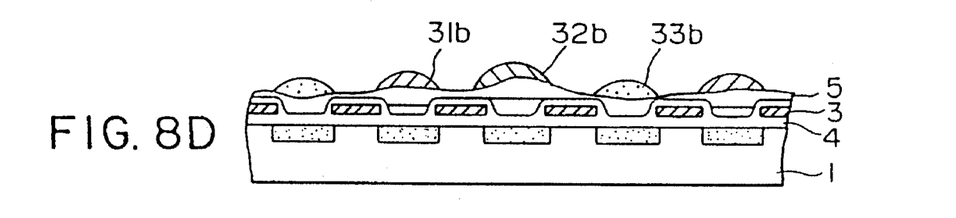

By using the convex lens shaped lens forming layer 35 as a mask, the color filter layers 31b, 32b and 33b are all etched from the side of the lens forming layer 35 in accordance with RIE (reactive ion etching) technique, in order to form the respective color filter layers into convex lens shape as shown in FIG. 8(d). In the colored microlenses thus formed, the focal distances of the respective colored microlenses are adjusted according to the color of the microlenses, respectively.

Figure 9A:
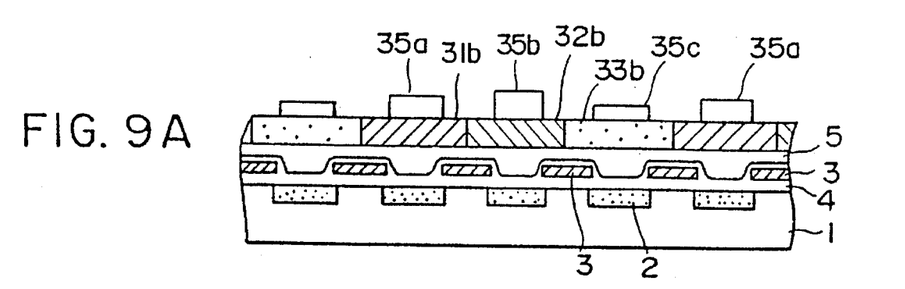
FIGS. 9(a) to (c) are cross-sectional views for assistance in explaining the steps of forming the colored microlenses with the different radii of curvature on the solid-state image sensing device.
Figure 9B:
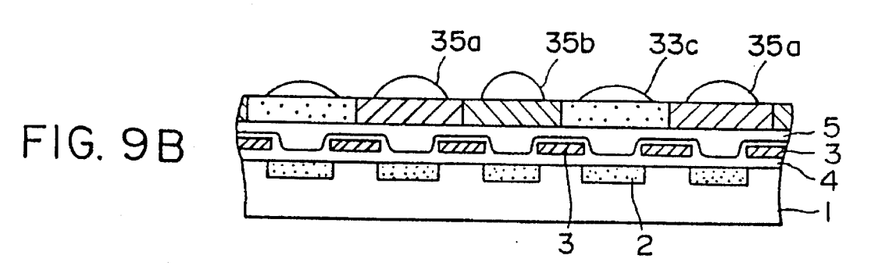
Figure 9C:
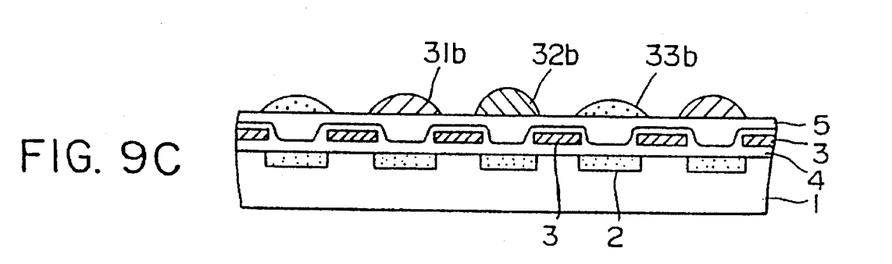

Another method of adjusting the focal distances of the colored microlenses according to the color of the microlenses will be described with reference to FIGS. 9(a) to (c). In this method, the radius of curvature of each microlens differs according to the color of the microlenses. In other words, the colored microlenses having different radii of curvature are formed on the respective optoelectro transducer regions. In FIGS. 9(a) to (c), the same reference numerals have been retained for similar regions or elements which have the same functions in FIGS. 5(b) to (d), without repeating any detailed description thereof.

The optoelectro transducer regions 2, the light shading film 3, the insulating film 4, the smoothing layer 5 and the respective color filter layers 31b, 32b and 33b are formed on the silicon substrate 1 in accordance with the procedure as already described. Further, a first color lens forming layer 35a for forming the first color microlenses is formed on the color filter array. This first color lens forming layer 35a is deposited to such an extent as to provide a thickness corresponding to the radius of curvature of the first-color microlenses. On the first color lens forming layer 35a, a mask for covering the aperture portions of the first-color optoelectro transducer regions is formed to remove the first color lens forming layer 35a other than the aperture portions of the first-color optoelectro transducer regions, so that only the necessary first color lens forming layer 35a can be obtained.

Successively, a second color lens forming layer 35b for forming the second color microlenses is formed on the color filter array. This second color lens forming layer 35b is deposited to such an extent as to provide a thickness corresponding to the radius of curvature of the second-color microlenses. On the second color lens forming layer 35b, a mask for covering the aperture portions of the second-color optoelectro transducer regions is formed to remove the second color lens forming layer 35b other than the aperture portions of the second-color optoelectro transducer regions, so that only the necessary second lens forming layer 35b can be obtained.

In the same way, a third color lens forming layer 35c for forming the third color microlenses is formed on the color filter array. This third color lens forming layer 35c is deposited to such an extent as to provide a thickness corresponding to the radius of curvature of the third-color microlenses. On the third color lens forming layer 35c, a mask for covering the aperture portions of the third-color optoelectro transducer regions is formed to remove the third color lens forming layer 35c other than the aperture portions of the third-color optoelectro transducer regions, so that only the necessary third color lens forming layer 35c can be obtained. As described above, it is possible to deposit the respective color lens forming layers 35a, 35b and 35c having different thicknesses on the aperture portions of the first, second and third color optoelectro transducer regions, respectively, as shown in FIG. 9(a).

The formed lens forming layers 35a, 35b and 35c are melted by heat. The melted lens forming layers 35a, 35b and 35c are formed into semispherical shape due to surface tension, respectively, as shown in FIG. 9(b). The radii of curvature (the curved surfaces) of the semispherical shapes are different from each other according to the thicknesses of the respective lens forming layers 35a, 35b and 35c, respectively. By using the convex-lens shaped lens forming layers 35a, 35b and 35c whose radii of curvature are different according to colors as a mask, the color filter layers 31a, 31b and 31c are etched in accordance with the RIE technique, for instance to obtain the convex-lens shaped color filter array, that is, colored microlenses, as shown in FIG. 9(c).

As described above, it is possible to form a colored microlens group having radii of curvature different from each other according to colors over the aperture portions of the light shading film 3 and in the vicinity of the optoelectro transducer regions, so that it is possible to effectively allow light to be incident upon the optoelectro transducer regions.

Another method of forming the colored microlenses will be described hereinbelow with reference to FIGS. 10(a) to (f), in which only the essential portions are shown without showing the optoelectro transducer regions 2, the light shading film 3 and the insulating film 4 all formed on the silicon substrate 1. The feature of this microlens forming method is to replace the lens forming layer 35 shown in FIGS. 5(a) to (d) with a photoresist 20.

Figure 10A:
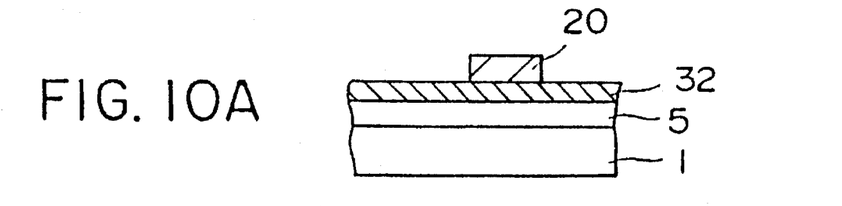
FIGS. 10(a) to (f) are cross-sectional views for assistance in explaining the other steps of forming the colored microlenses.
Figure 10B:
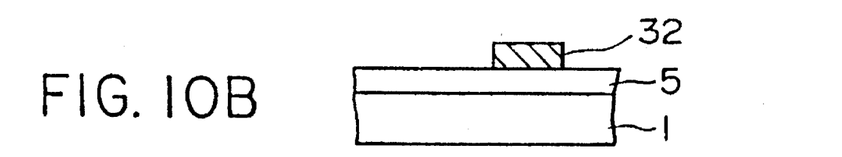
Figure 10C:
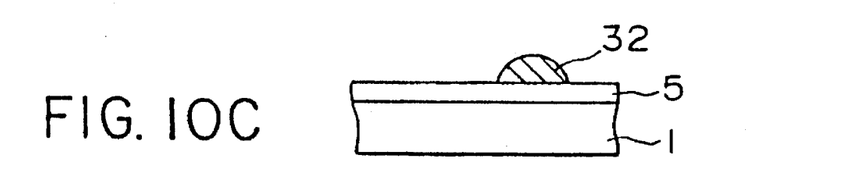

First, a color filter layer (e.g. the second-color filter layer 32) is formed all over the smoothing layer 5. A photoresist 20 is applied all over the second-color filter layer 32, and then exposed through a second-color microlens pattern for forming the second-color microlenses over the aperture portions of the second-color optoelectro transducer regions. The exposed photoresist 20 is developed to remove the photoresist 20 other than the aperture portions, as shown in FIG. 10(a). By using the developed photoresist 20 as a mask, the second-color filter layer 32 is etched to leave the second-color filter layer 32 only over the aperture portions of the second-color optoelectro transducer regions, as shown in FIG. 10(b). The remaining second-color filter layer 32 is melted by heat treatment for instance, to form the convex-lens as shown in FIG. 10(c), so that it is possible to obtain a group of second-color microlenses.

Figure 10D:
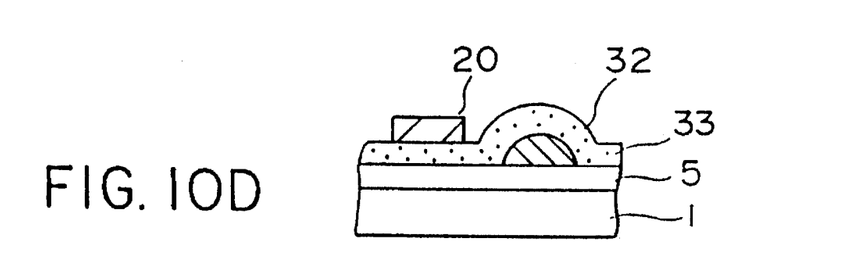
Figure 10E:
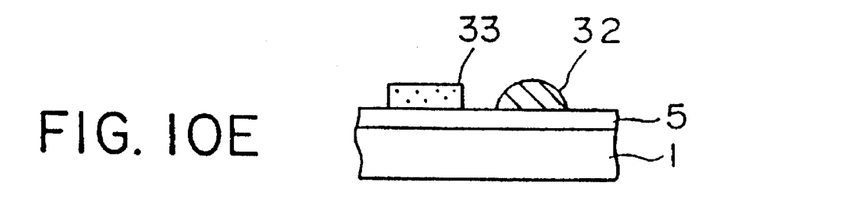
Figure 10F:
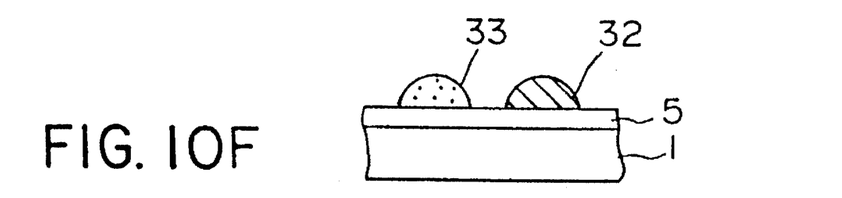

Successively, another color filter layer (e.g. the third-color filter layer 33) is formed all over the smoothing layer 5 and the second-color microlenses 32. A photoresist 20 is applied to the third-color filter layer 33 and then exposed through a microlens pattern for forming the third-color microlenses over the aperture portions of the third-color optoelectro transducer regions. The exposed photoresist 20 is developed to remove the photoresist 20 other than the aperture portions, as shown in FIG. 10(d). By using the developed photoresist 20 as a mask, the third-color filter layer 33 is etched to leave the third-color filter layer 33 only over the aperture portions of the third-color optoelectro transducer regions, as shown in FIG. 10(e). The remaining second-color filter layer 33 is melted by heat treatment for instance, to form the convex-lens as shown in FIG. 10(f), so that it is possible to obtain a group of third-color microlenses.

In the same way, the first-color microlens group can be obtained.

Further, being different from the above-mentioned methods, it is also possible to dye the transparent microlenses, separately according to the respective optoelectro transducer regions, after the microlenses have been all formed. For instance, a first mask is formed on the microlens group by opening only the first-color microlenses corresponding to the first-color optoelectro transducer regions, and then the opened microlenses are dyed. Thereafter, the first mask is removed and a second mask is formed on the microlens group by opening only the second-color microlenses corresponding to the second-color optoelectro transducer regions, and then the opened microlenses are dye. Thereafter, the second mask is removed. The above-mentioned procedure is repeated to obtain a plurality of microlens groups dyed in different colors.

Figure 11A:
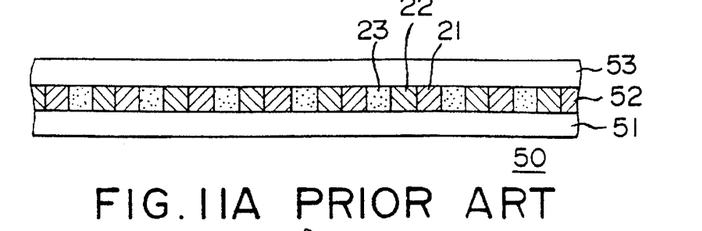
FIG. 11A is a cross-section view for assistance in explaining a prior art color liquid crystal display unit.

The above-mentioned colored microlenses can be applied to various devices or elements. FIG. 10A shows a prior art color liquid crystal display unit 50, which is composed of a shutter layer 51 including pixel electrodes, opposing electrodes and liquid crystal; a color filter array 52 including color filters formed on the respective units of liquid crystal shutters (the respective pixels of the liquid crystal shutter layer 51), and a protective glass layer 53. Further, the color filter array 52 is composed of a first color filter 21, a second color filter 22 and a third color filter 23.

Figure 11B:
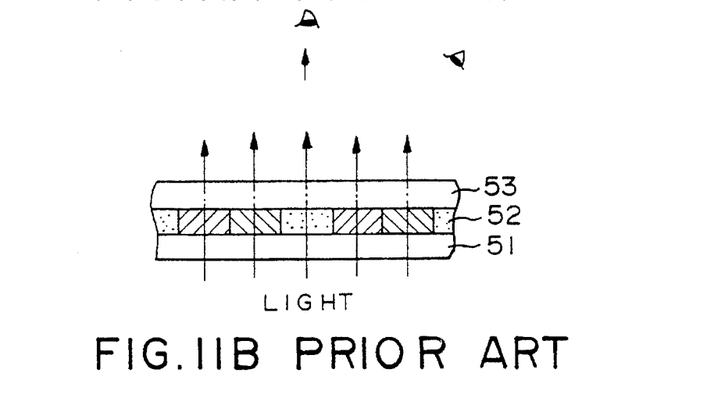
FIG. 11B is a cross-sectional view for assistance in explaining the angle of visual field of the prior art color liquid crystal display unit.

In the prior art liquid crystal display unit 50 as described above, an image through the liquid crystal display unit can be seen well when seen from the direction perpendicular to the display panel surface, as shown in FIG. 11B. However, when seen obliquely from over the display panel surface, the image cannot be well seem, because of a dark picture surface.

Figure 12A:
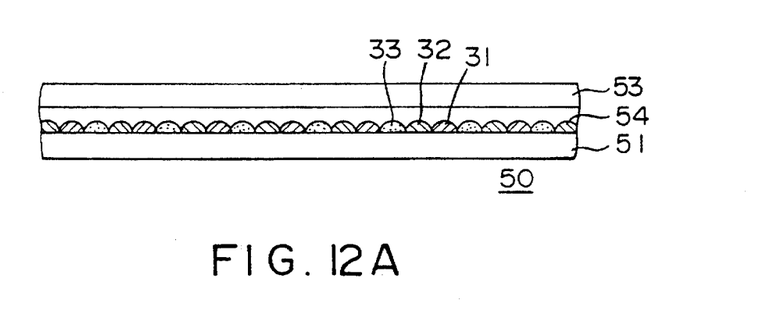
FIG. 12A is a cross-sectional view showing the color liquid crystal display unit using the colored microlenses according to the present invention.
Figure 12B:
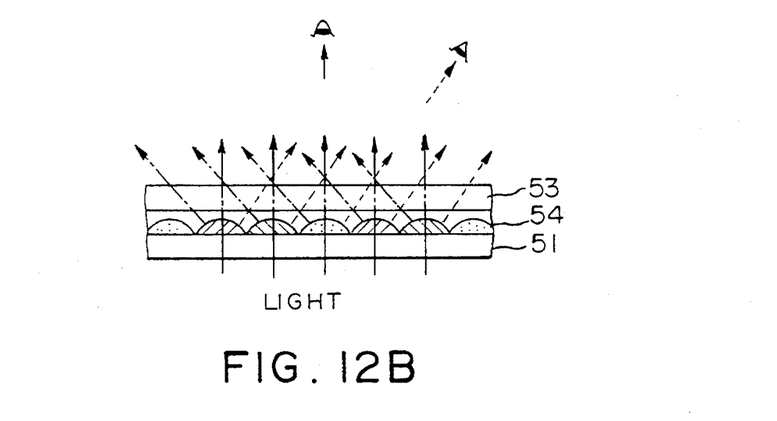
FIG. 12B is a cross-sectional view for assistance in explaining the angle of visual field of the color liquid crystal display unit using the colored microlenses according to the present invention.

To overcome this problem, when the color filter array 52 of the color liquid crystal display unit 50 is replaced with the colored microlenses 54 composed of the first-color microlens 31, the second-color microlens 32 and the third-color microlens 33, as shown in FIG. 12A, it is possible to well see the image through the liquid crystal display unit even when seen obliquely from over the display panel surface, in the same way as seen from the direction perpendicular to the display panel surface. This is because the light passed through the colored microlens array 54 which functions as the color filter array can be broadened in the oblique directions relative to the display panel surface. That is, it is possible to widen the angle of visual field of the liquid crystal display unit. In addition, there exists another advantage such that the thickness of the liquid crystal display unit can be reduced.

Further, in the above-mentioned method of forming the lens forming layer, a positive print type photoresist can be also used. In the case of the colored microlens forming method as shown in FIGS. 5(a) to (d), for instance, the lens forming layer 35 is unnecessary, and the photoresist 20 is formed directly on the filter 31b, the filter layer 32b and the filter layer 33b, as shown in FIG. 5(a). Further, the photoresist 20 (as shown by 35) is etched according to the optoelectro transducer regions, as shown in FIG. 5(b); the etched photoresist 20 is dissolved to obtain the semispherical photoresist 20 (as shown by 35), as shown in FIG. 5(c); and the lens shapes are transferred to the color filter array by using the semispherical photoresist 20 as a mask, as shown in FIG. 5(d).

Further, in the above-mentioned embodiments, the microlenses of plural colors are formed. Without being limited thereto, it is of course possible to form the colored microlenses of the present invention as the microlenses of a single color. In this case, for instance, it is possible to construct an image sensing apparatus in such a way that the solid-state image sensing device formed with only the red microlenses, the solid-state image sensing device formed with only the blue microlenses, and the solid-state image sensing device formed with only the green microlenses are arranged separately; and the same image is projected upon the respective three image sensing devices, respectively to obtain the R signal, B signal and G signal by the three different solid-state image sensing devices, separately.

As described above, in the colored microlenses according to the present invention, since the microlenses themselves additionally function as the color filter array, it is possible to realize both the functions of the prior art microlenses and the prior art color filter array formed by laminating plural color filter layers one upon another, with the use of only the colored microlenses according to the present invention.

Further, in the method of manufacturing the colored microlenses according to the present invention, the microlens shapes are formed on the color filter array; and the formed microlens shapes are transferred to the color filter array by etching in order to change the color filter array into microlenses in shape. Therefore, it is possible to select any desired color for each microlens group and therefore it is possible to manufacture the colored microlenses which can function as the colored filter array.

Further, when the colored microlenses of the present invention is incorporated in the solid-state color image sensing device, since no thick color filter array layer is required, being different from the prior art color image sensing device, the microlenses can be arranged in the vicinity of the optoelectro transducer regions. Accordingly, when the lens aperture is broadened and therefore light is allowed to be incident upon the optoelectro transducer regions obliquely, it is possible to prevent the light converging rate from being reduced and therefore to keep high the light-sensitivity of the solid-state image sensing device even when the diameter of the lens diaphragm is increased open.

Furthermore, when the colored microlenses according to the present invention are applied to the color liquid crystal display unit, it is possible to widen the angle of visual field of the color liquid crystal display panel.

What is claimed is:

1. A colored microlens array, comprising:

a transparent basic layer; and a plurality of colored microlenses of different colors, each colored microlens serving as a color filter, formed on said transparent basic layer in a two dimensional arrangement in accordance with at least one basic color arrangement pattern, wherein a thickness of said transparent basic layer differs according to a color of a colored microlens formed thereon such that foci of said colored microlenses are located substantially on the same plane.

2. A colored microlens array, comprising:

a transparent basic layer; and a plurality of colored microlenses of different colors, each colored microlens serving as a color filter, formed on said transparent basic layer in a two dimensional arrangement in accordance with at least one basic color arrangement pattern, wherein a radius of curvature of each of said colored microlenses differs according to a color of said colored microlens such that foci of said colored microlenses are located substantially on the same plane.

* * * * *